United States Patent
Yamashita (10) Patent No.: US 11,251,025 B2
(45) Date of Patent: Feb. 15, 2022

(54) PROCESSING DEVICE HAVING OPENING ENABLING GAS TO COMMUNICATE BETWEEN DIFFUSION PATH AND TREATMENT CHAMBER AND MEMBER HAVING DIFFUSION PATH

(71) Applicant: Tokyo Electron Limited, Tokyo (JP)

(72) Inventor: Jun Yamashita, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 82 days.

(21) Appl. No.: 16/161,486

(22) Filed: Oct. 16, 2018

(65) Prior Publication Data
US 2019/0122868 A1     Apr. 25, 2019

(30) Foreign Application Priority Data
Oct. 19, 2017  (JP) .............................. JP2017-202457

(51) Int. Cl.
*H01J 37/32* (2006.01)
*C23C 16/44* (2006.01)
*C23C 16/455* (2006.01)

(52) U.S. Cl.
CPC .... *H01J 37/32633* (2013.01); *C23C 16/4412* (2013.01); *C23C 16/455* (2013.01); *C23C 16/45591* (2013.01); *H01J 37/321* (2013.01); *H01J 37/32449* (2013.01); *H01J 37/32834* (2013.01)

(58) Field of Classification Search
CPC ........... C23C 16/4412; C23C 16/45591; H01J 37/32834; H01J 37/32633
See application file for complete search history.

(56) References Cited

U.S. PATENT DOCUMENTS

| | | | | |
|---|---|---|---|---|
| 2003/0094135 A1* | 5/2003 | Komiya | ............... | C23C 16/4412 118/715 |
| 2003/0227258 A1* | 12/2003 | Strang | ............... | H01J 37/32449 315/111.21 |
| 2006/0236932 A1* | 10/2006 | Yokogawa | ........ | H01J 37/32633 118/723 E |
| 2009/0250169 A1* | 10/2009 | Carducci | ........... | H01J 37/32495 156/345.34 |
| 2011/0042009 A1* | 2/2011 | Lee | ................... | H01J 37/32633 156/345.43 |

(Continued)

FOREIGN PATENT DOCUMENTS

| CN | 105895553 | 8/2016 |
|---|---|---|
| JP | 2009-016453 | 1/2009 |
| JP | 2017-028099 | 2/2017 |

*Primary Examiner* — Binu Thomas
(74) *Attorney, Agent, or Firm* — IPUSA, PLLC (57) ABSTRACT

In a processing device including a reaction container that receives a gas flowing into the reaction container and performs a predetermined process in a treatment chamber, a member that communicates with an exhaust port at a portion in which a diffusion path of a sidewall or a bottom wall of the reaction container is formed, and an opening that is present between the member having the diffusion path and the reaction container to cause the diffusion path and a space of the treatment chamber to communicate, in order to avoid a shift of the gas in the treatment chamber, an opening area of the opening is made narrower as a position of the opening area is closer to the exhaust port.

13 Claims, 11 Drawing Sheets

(56) References Cited

U.S. PATENT DOCUMENTS

| | | | |
|---|---|---|---|
| 2013/0189851 A1* | 7/2013 | Chou | C23C 16/45591 |
| | | | 118/725 |
| 2015/0060404 A1* | 3/2015 | Dhindsa | H01J 37/32449 |
| | | | 156/345.28 |
| 2015/0197846 A1* | 7/2015 | Sung | C23C 16/4412 |
| | | | 118/715 |
| 2016/0237559 A1* | 8/2016 | Tsuji | C23C 16/4412 |
| 2016/0260582 A1* | 9/2016 | Hosaka | H01J 37/32633 |

* cited by examiner

| CONTINUOUS FLOW | Kn<0.01 |
|---|---|
| SLIP FLOW | 0.01<Kn<0.1 |
| TRANSITION FLOW | 0.1<Kn<10 |
| MOLECULE FLOW | Kn>10 |

PROCESSING DEVICE HAVING OPENING ENABLING GAS TO COMMUNICATE BETWEEN DIFFUSION PATH AND TREATMENT CHAMBER AND MEMBER HAVING DIFFUSION PATH

CROSS-REFERENCE TO RELATED APPLICATIONS

This patent application is based upon and claims priority to Japanese Patent Application No. 2017-202457 filed on Oct. 19, 2017, the entire contents of which are incorporated herein by reference.

BACKGROUND

1. Field

The present disclosure generally relates to a processing device and a member having a diffusion path.

2. Description of the Related Art

A semiconductor manufacturing process includes a step of selectively etching a resist film formed on a surface of a substrate to be processed such as a semiconductor wafer (hereinafter, simply referred to as a "wafer") using a resist film formed on the surface of the wafer, and removing the resist film by ashing.

An apparatus for performing ashing is proposed as a plasma process apparatus (for example, PATENT DOCUMENT 1) having a plasma generation chamber for generating plasma from a gas and a treatment chamber that communicates with the plasma generation chamber through a partition wall member and performs ashing using plasma mainly radical.

The partition wall member has multiple through holes, is made of quartz or the like, and functions to attract and catch ions of plasma generated in a plasma generation chamber by adjusting the potential of the partition wall member to be a ground level, for example and to cause radical to be passed from multiple through holes to the treatment chamber.

The gas in the treatment chamber is exhausted from the exhaust port provided in the treatment chamber to the outside. At this time, if a shift occurs in exhaust gas inside the treatment chamber in response to the position of the exhaust port, the property of a process of the wafer such as ashing rate is influences by the shift of exhaust gas so as to degrade uniformity of a desired process such as an ashing process to the wafer. Therefore, there is proposed a method of installing a ring-like current plate in order to suppress generation of shift (for example, PATENT DOCUMENT 2).

[Patent Document 1] Japanese Laid-open Patent Publication No. 2009-16453

[Patent Document 2] Japanese Laid-open Patent Publication No. 2017-28099

SUMMARY

However, even though a current plate is provided in a gas exhaust space, intake force of the gas becomes strong in the vicinity of the gas exhaust port. Therefore, it is difficult to remove a gas exhaust shift inside the treatment chamber using the current plate.

As one aspect, the object of the present invention is to cancel a shift of the exhaust gas in the treatment chamber.

A processing device including a reaction container that receives a gas flowing into the reaction container and performs a predetermined process in a treatment chamber, a member that communicates with an exhaust port at a portion in which a diffusion path of a sidewall or a bottom wall of the reaction container is formed, and an opening that is present between the member having the diffusion path and the reaction container to cause the diffusion path and a space of the treatment chamber to communicate, an opening area of the opening being narrower as a position of the opening area is closer to the exhaust port. Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF EMBODIMENTS

Even though a current plate is provided in a gas exhaust space, intake force of the gas becomes strong in the vicinity of the gas exhaust port. Therefore, it is difficult to remove a gas exhaust shift inside the treatment chamber using the current plate.

A description of embodiments of the present invention is given below, with reference to the FIG. 1 through FIG. 8.

The embodiments described below are only examples and the present invention is not limited to the embodiments.

Through all figures illustrating the embodiments, the same references symbols are used for portions having the same function, and repetitive explanations of these portions are omitted.

Reference symbols typically designate as follows:
10: plasma process apparatus
102: treatment chamber
104: plasma generation chamber
105: heater
106: mounting stage
107: lid
110: container 116: backflow prevention wall
118: high-frequency power source
119: coil
120: gas supplying unit
121, 122: gas plumbing
123: gas diffusion path
126: exhaust port
128: exhaust device
130: gate valve
134: liner
135: diffusion path
136: opening
140: partition wall member
144: through hole

[Structural Example of Plasma Process Apparatus]

Figure 1:
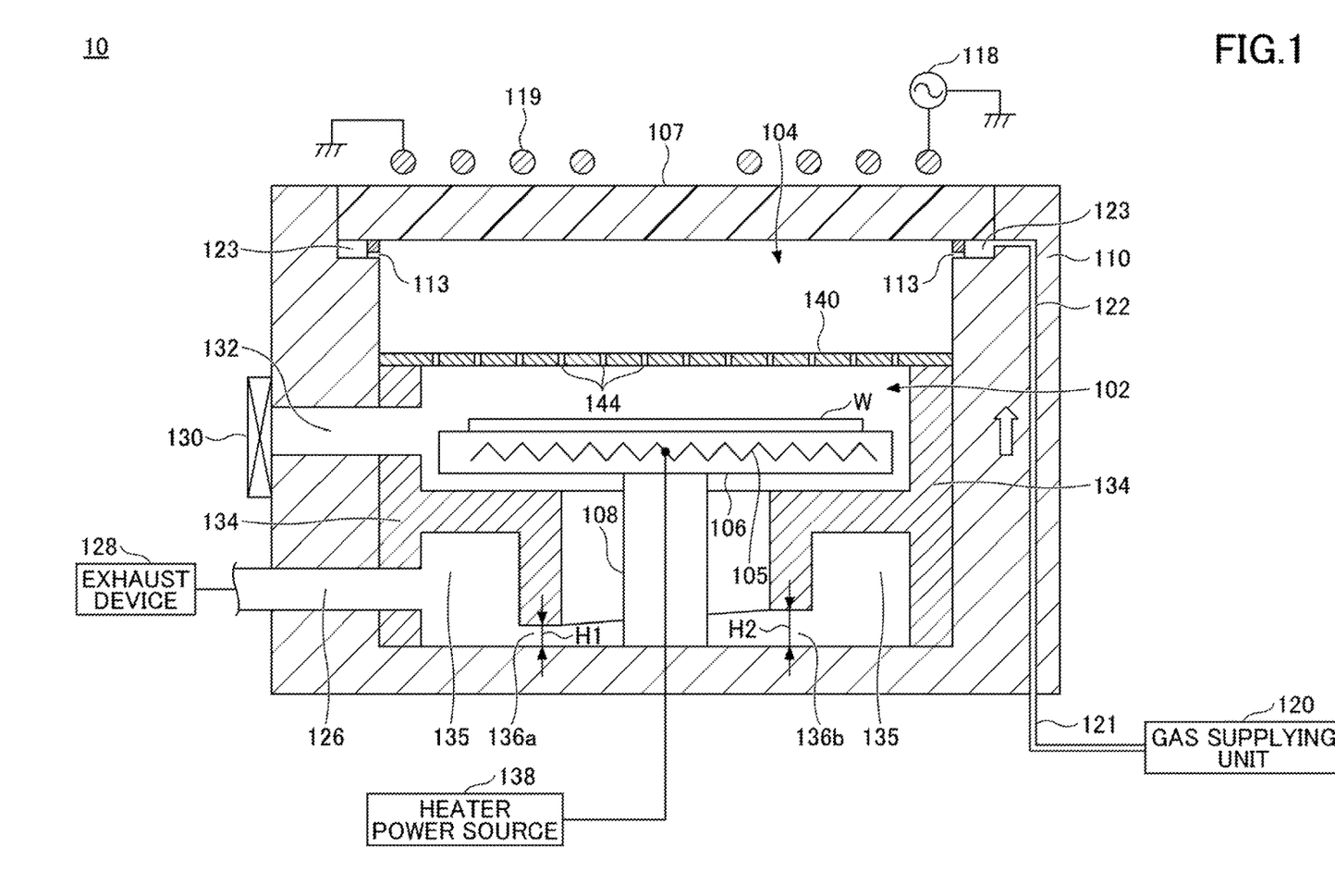
FIG. 1 illustrates an example of a plasma process apparatus according to an embodiment of the present invention.

At first, referring to FIG. 1, an example of the structure of a plasma process apparatus of an embodiment of the present invention is described. FIG. 1 illustrates an example of the structure of the plasma process apparatus of this embodiment of the present invention. The plasma process apparatus 10 performs a plasma process such as an ashing process of removing a photo resist film on a film to be etched that is formed on the wafer W using ashing. The plasma process apparatus 10 is an example of a processing device in which a gas is flown and a predetermined process is performed.

The plasma process apparatus 10 includes a treatment chamber 102 in which the wafer W is processed, and a plasma generation chamber 104 that communicates with the treatment chamber 102 and caused the gas to be exited to generate plasma. The plasma generation chamber 104 is provided above the treatment chamber 102 through a partition wall member 140 and generates the plasma from the gas by the Inductively Coupled Plasma (ICP).

The plasma generation chamber 104 and the treatment chamber 102 includes a substantially cylindrical reaction container 110 made of metal such as aluminum. An upper part of the reaction container 110 is hermetically closed by a substantially disk-like lid 107 made of an insulating member such as quartz, ceramics, or the like.

The gas flow path 122 is installed in the reaction container 110. The gas flows from the gas supplying unit 120 through the gas plumbing 121 and the gas flow path 122 into the gas diffusion path 123 that is formed like a ring in a peripheral direction at an outer peripheral end of the lid 107. Then, the gas is introduced from a gas flow inlet 113 into an internal space of the plasma generation chamber 104. The gas supplying unit 120 includes an on-off valve for opening and closing supply of the gas, a mass flow controller for controlling the gas flow rate, and so on are provided. Within the embodiment, described is a case where a mixed gas of a hydrogen (H2) gas and Argon (Ar) gas is supplied, for example. However, the type of the gas is not limited thereto.

A coil 119 as an antenna member is wound at an at an upper portion of the reaction container 110. A high-frequency power source 118 is connected to the coil 119. The high-frequency power source 118 outputs power with a frequency of 300 kHz to 60 MHz and supplies to the coil 119. With this, an induced magnetic field is formed inside the plasma generation chamber 104, and the gas introduced into the plasma generation chamber 104 is excited. Thus, the plasma is generated.

A mounting stage 106 for mounting the wafer W is provided inside the treatment chamber 102. The mounting stage 106 is supported by a supporting member 108 provided in a bottom portion of the treatment chamber 102. The mounting stage 106 is formed by aluminum subjected to, for example, alumite treatment. A heater 105 for heating the wafer W is embedded in the mounting stage 106. The heater 105 is supplied with electricity from a heater power source 138 so that the wafer W is heater 105 to have a predetermined temperature (for example, 300° C.). At this time, the temperature may be in a range of about 250° C. to 400° C. so that a film to be etched on the wafer is not greatly damaged.

A liner 134 for protecting the inner wall of the treatment chamber is provided inside the treatment chamber 102. The liner 134 is made of aluminum, for example. A ring-like diffusion path 135 is formed inside the liner 134. The ring-like diffusion path 135 is provided on a lower side of the mounting stage 106 and communicates with the exhaust port 126 extending in a lateral direction. The exhaust port 126 penetrates through the liner 134 and the sidewall of the treatment chamber 102 and is connected to the exhaust device 128 including the vacuum pump. With this, the insides of the treatment chamber 102 and the plasma generation chamber 104 can be depressurized down to a predetermined degree of vacuum. However, the exhaust port 126 is not limited to have a structure such that the exhaust port 126 is formed in a lateral direction at a portion where the diffusion path 135 of the sidewall of the container 110 is formed but also a structure such that the exhaust port 126 is formed in a downward direction at a portion where the diffusion path 135 of the bottom wall of the container 110 is formed. Further, the exhaust port 126 is not limited to have a shape of straightly penetrates in the lateral direction but a shape of communicating with the diffusion path 135 at the sidewall, turning in the downward direction, and penetrating through the bottom wall. The liner 134 is an example of a member having the ring-like diffusion path 135 communicating with the exhaust port at a portion of the sidewall or the bottom wall of the container 110 in which the diffusion path 135 is formed.

Between the liner 134 and the reaction container 110, formed is an opening 136 that causes the spaces of the diffusion path 135 and the treatment chamber 102 communicate and has a slant in the peripheral direction. Referring to FIG. 1, openings 136a and 136b are illustrated as a part of the opening 136. The opening 136 is present between the liner 134 and the bottom wall of the reaction container 110 and has a predetermined slant in the peripheral direction.

A carry-in and carry-out port 132, which is freely opened or closed by the gate valve 130, is formed in the sidewall of the treatment chamber 102. The wafer W is carried in and out by a transfer mechanism such as a transfer arm (not illustrated).

Figure 2:
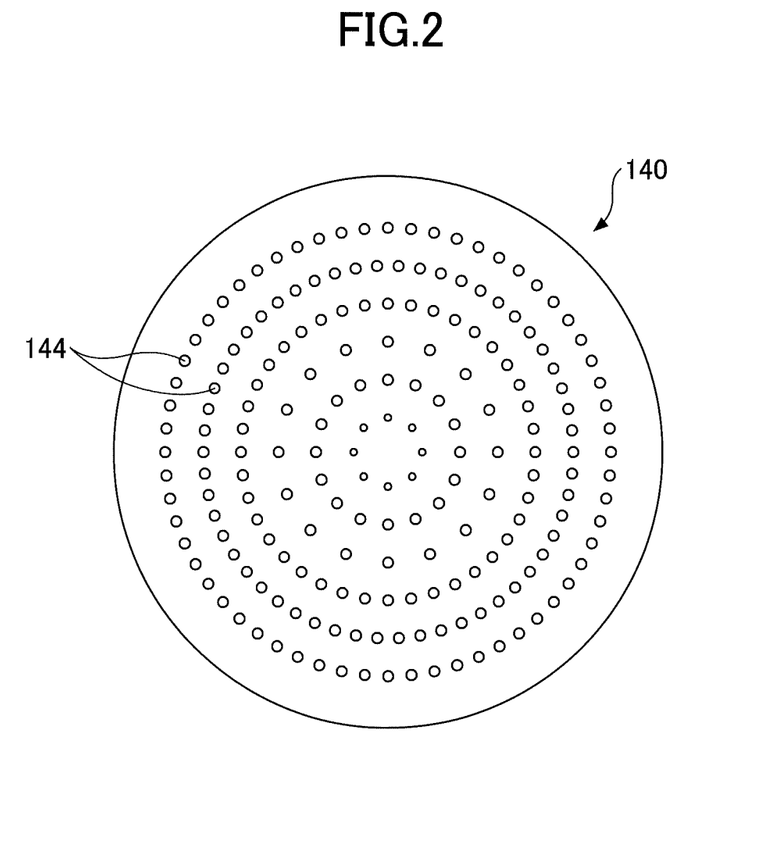
FIG. 2 illustrates an example of a partition wall member according to the embodiment of the present invention.

A plurality of through holes 144 are formed in the partition wall member 140 for separating the treatment chamber 102 and the plasma generation chamber 104 between the treatment chamber 102 and the plasma generation chamber 104. FIG. 2 illustrates an example of arrangement of the plurality of through holes 144 penetrating through the partition wall member 140. The plurality of through holes 144 are formed in the partition wall member 140 so as to be arranged along concentric circles. The arrangement and the number of the through holes are not limited to an example of FIG. 2.

The partition wall member 140 allows radical in the plasma generated in the plasma generation chamber 104 to pass through the plurality of through holes 144 into the treatment chamber 102. Said differently, when the gas is excited in the plasma generation chamber 104 to generate plasma, radicals, ions, ultraviolet rays, and so on are generated. The partition wall member 140 is made of quartz or the like, blocks the ions and the ultraviolet rays generated by the plasma generation chamber 104, and causes only the radical to pass through into the treatment chamber 102.

In a case where the plasma process apparatus 10 performs a plasma processing for the wafer W, the gate valve 130 is opened, the wafer W is carried into the treatment chamber 102 from the carry-in and carry-out port 132 and is mounted on the mounting stage 106.

Next, the gate valve 130 is closed to exhaust the inside of the treatment chamber 102 and the inside of the plasma generation chamber 104 by the exhaust device 128 to make a predetermined depressurized state. Predetermined electric power is supplied from a heater power source 138 to the heater 105 so that the wafer W has a predetermined temperature (for example, 300° C.)

Subsequently, the hydrogen gas and the argon gas are supplied from the gas supplying unit 120 into the plasma generation chamber 104 through the gas pipes 121 and 122 and the gas diffusion path 123. High-frequency power of, for example, 4000 W is supplied from the high-frequency power source 118 to the coil 119 so as to form a magnetic field inside the plasma generation chamber 104. With this, the plasma is generated from the hydrogen gas and the argon gas in the plasma generation chamber 104. Among the generated plasma, ultraviolet light and ions are blocked by the partition wall member 140, and radical passes through the partition wall member 140. With this, a desirable process such as the ashing process of the photoresist film on, for example, the wafer W can be performed without a damage of the surface of the wafer W inside the treatment chamber 102 caused by the ultraviolet light and the hydrogen ions.

Within the embodiment, the plasma is generated by an induction coupled plasma method using the plasma generation chamber 104. However, the generation is not limited thereto.

[Gas Flow in the Treatment Chamber]

According to this structure, by operating the exhaust device 128, the gas present in the space of the treatment chamber 102 passes below the mounting stage 106, flows from the opening 136 to the diffusion path 135, and is ejected outward from the exhaust port 126. At this time, because the intake of the gas becomes strong in the vicinity of the exhaust port 126, the exhaust gas inside the treatment chamber 102 causes a shift in response to the position of the exhaust port 126. With this, the ashing rate becomes non-uniform by an influence of the shift of the gas in the exhaust direction so as to degrade the uniformity of the ashing process.

Within this embodiment, the opening 136 is formed to have a slant along the peripheral direction so that the opening area becomes narrower at a position closer to the exhaust port 126. The opening area becomes narrower at the position closer to the exhaust port 126 and the opening area becomes wider at the position further from the exhaust port 126 so as to enable the conductance of the gas exhaust to be controlled.

Within this embodiment, the opening 136 is separated from the bottom portion of the container 110 in its entire periphery. A slant is formed in the peripheral direction through the entire periphery. Said differently, the opening 136 has the slant such that the opening 136a is the narrowest at the position closest to the exhaust port 126, and the opening 136b is the widest at the position furthest to the exhaust port 126. In comparison with the height H1 of the opening 136a and the height H2 of the opening 136b, the height H1 of the opening 136a is lower than the height H2 of the opening 136b so that the gas is hard to be flown in the vicinity of the exhaust port 126.

The cross-sectional area of the exhaust port 126 where the diffusion path 135 communicates with the exhaust port 126 is formed to be equal to or smaller than the cross-sectional area of the diffusion path 135. With this, the conductance of a gas flowing through the diffusion path 135 is equal to or higher than the conductance of a gas flowing through the exhaust port 126.

The opening 136 may not only open along the entire periphery but also be multiple separate slits. In this case, the opening areas of the slits in the opening 136 are smaller at a position closer to the exhaust port 126 so as to form a slant in the peripheral direction.

The opening 136 may have a filter. In this case, an opening ratio of the filter may be designed to change depending on a distance from the exhaust port 126. The opening ratio of the filter 13 may be set smaller at a position closer to the exhaust port 126. The filter may be a porous body and a member having multiple holes. In this case, the opening ratio of the filter is the porosity of the porous body or the diameter $\phi$ of minute holes formed in the member having multiple minute holes.

Further, within this embodiment, the number of the exhaust port 126 is one as the example, however, multiple exhaust ports 126 may be provided. In this case, the opening 136 is designed to be narrower at a position closer to the exhaust port 126 in any one of the multiple exhaust ports 126. In this case, the slant of the opening 136 may be changed to have an arch like shape so that recesses of the arches are positioned at the multiple exhaust ports 126, for example.

[Example of Result of Simulation]

Figure 3:
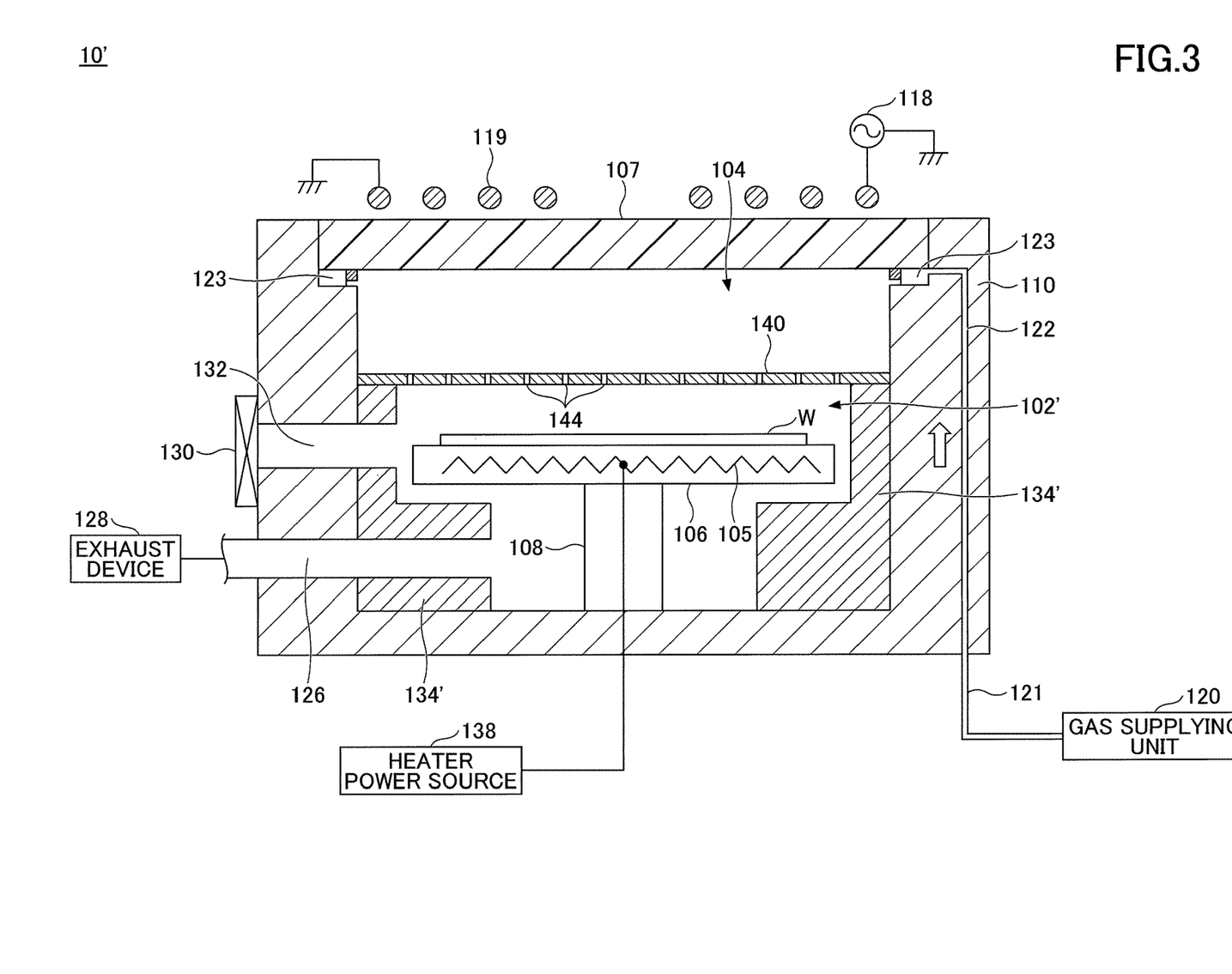
FIG. 3 illustrates an example of a plasma process apparatus according to a comparative example 1.
Figure 4:
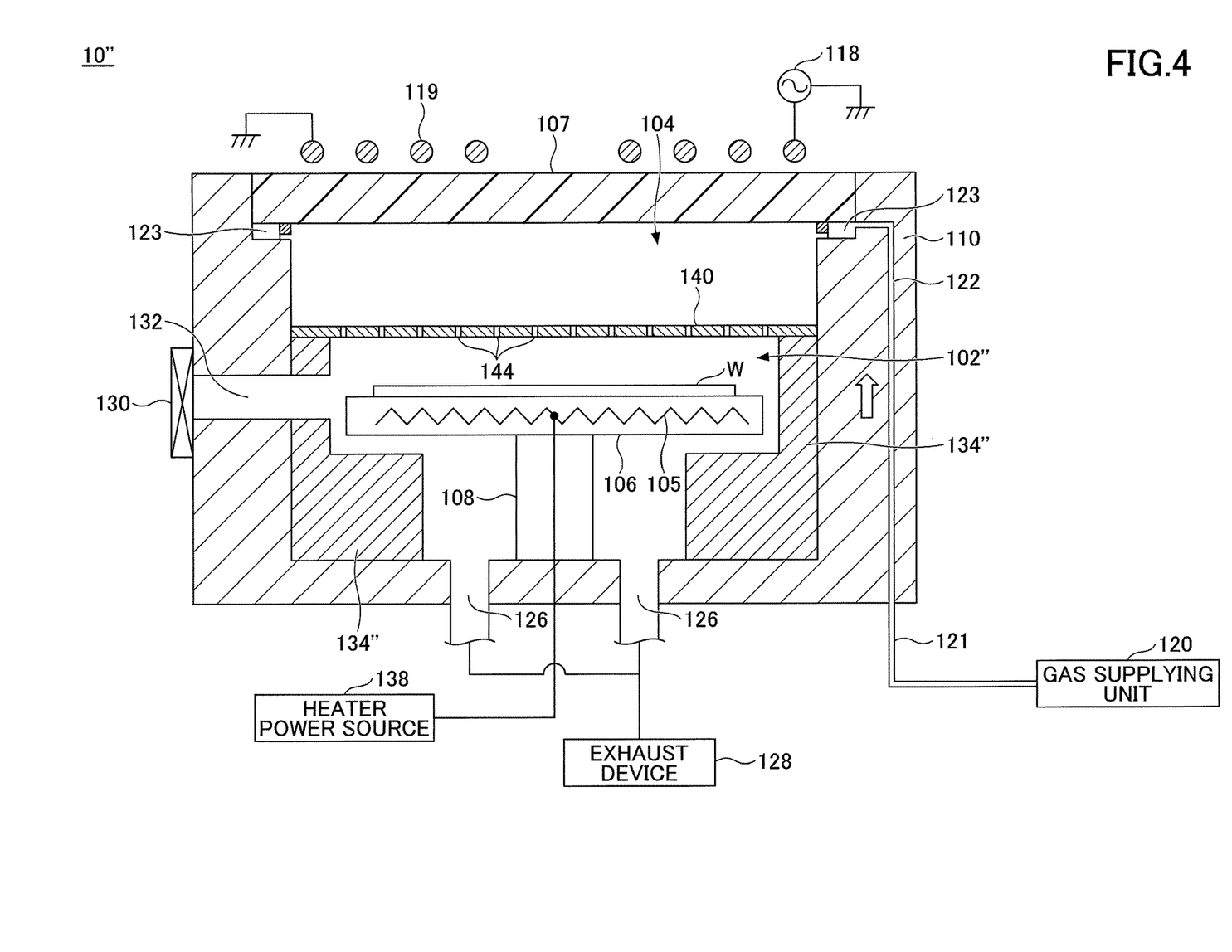
FIG. 4 illustrates an example of a plasma process apparatus according to a comparative example 2.

An example of the result of simulating pressure distribution inside the treatment chamber 102 of the embodiment is described in comparison with an example of the result of simulating pressure distribution inside treatment chambers 102' and 102" of the comparative example. FIG. 3 illustrates an example of the treatment chamber 102' of the plasma process apparatus 10' of the comparative example 1. FIG. 4 illustrates an example of the treatment chamber 102" of the plasma process apparatus 10" of the comparative example 2. As illustrated in FIG. 3, a diffusion path and an opening are not formed in the liner 134' inside the treatment chamber 102' of the plasma process apparatus 10' of the comparative example. The other part of the structure is the same as that of the plasma process apparatus 10 of the embodiment illustrated in FIG. 1.

Figure 5A:
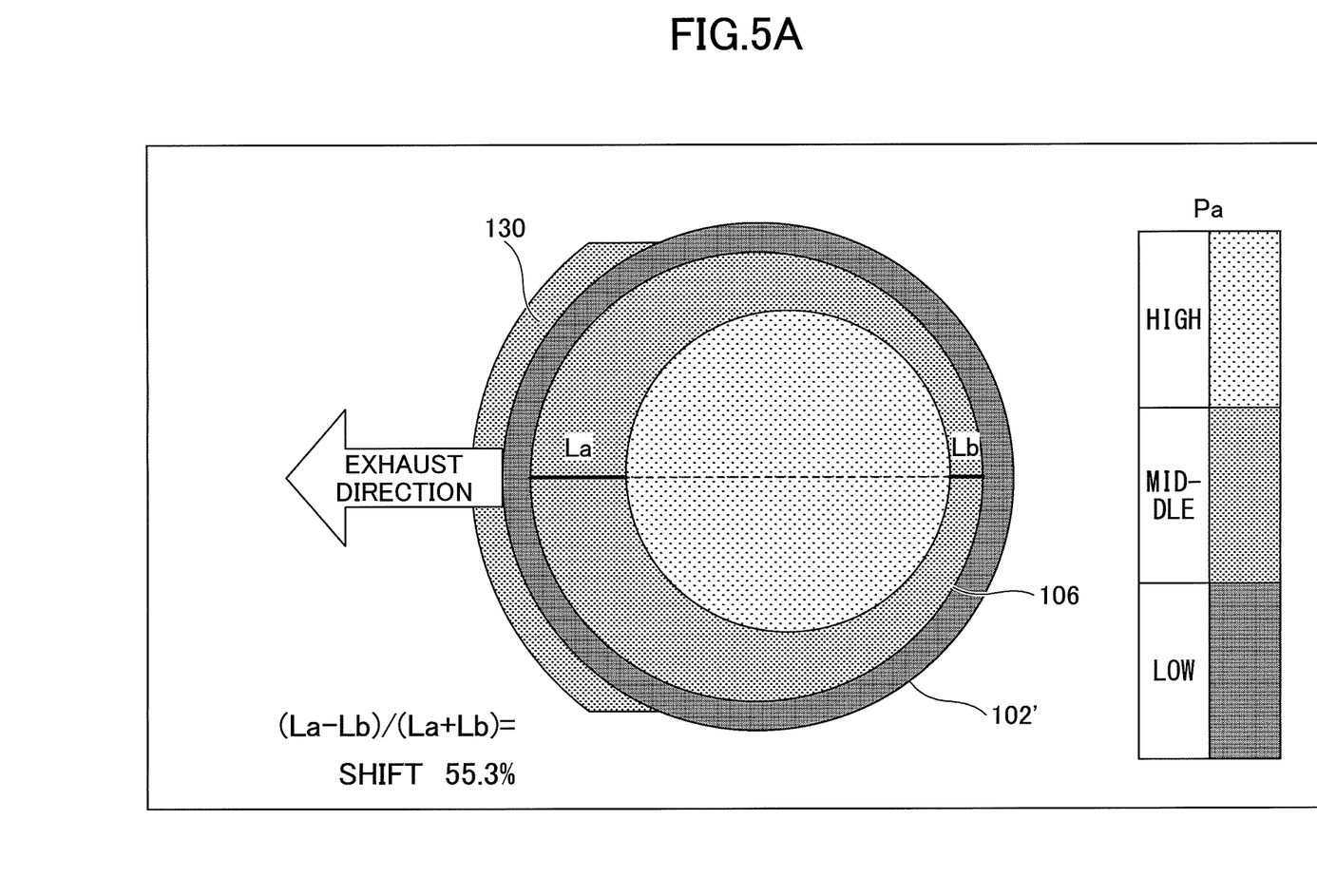
FIGS. 5A-5C illustrate an example of a simulation result of a pressure distribution of the treatment chamber according to an embodiment.
Figure 5B:
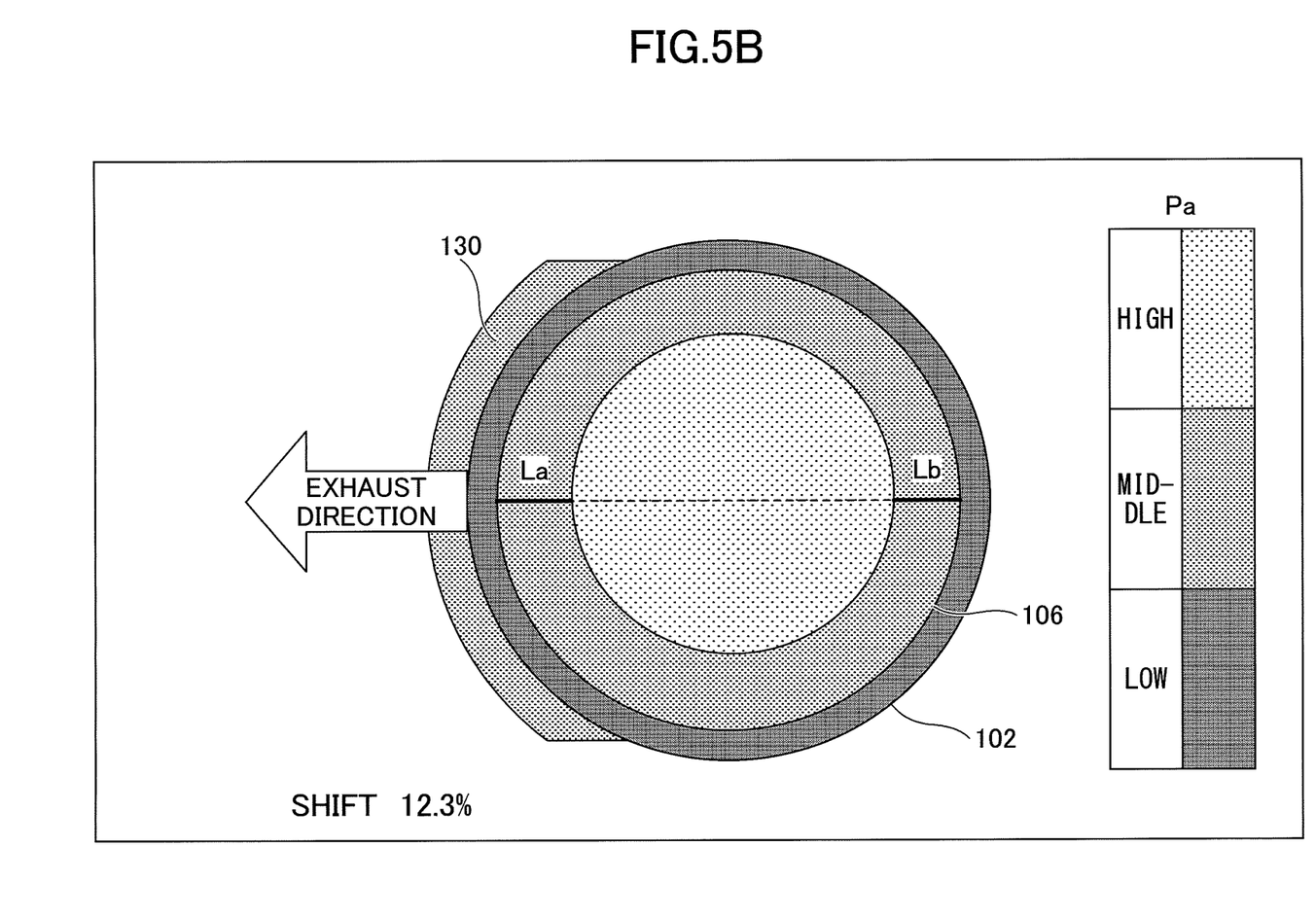

FIG. 5A illustrates an example of the result of simulating the pressure distribution on the mounting stage 106 inside the treatment chamber 102' of the plasma process apparatus 10' of the comparative example. FIG. 5B illustrates an example of the result of simulating the pressure distribution on the mounting stage 106 inside the treatment chamber 102 of the plasma process apparatus 10 of the embodiment.

The conditions of the simulation are set such that the flow rates of introducing a hydrogen gas is 500 sccm and an argon gas of 6200 sccm and the pressure of the treatment chambers 102, 102' of 2.5 Torr (333 Pa). The result of the simulation on the mounting stage 106 is evaluated using three stages of the level, namely, high, middle, and low.

Referring to FIG. 5A, the pressure distribution on the mounting stage 106 inside the treatment chamber 102' in the comparative example 1 is shifted such that a part having a higher pressure is present on a side opposite to a side on which the exhaust port 126 indicated using the arrow of the exhaust direction. Said differently, the pressure distribution has the shift inside the treatment chamber 102 inside the treatment chamber 102, the gas easily flows on the side on which the exhaust port 126 is formed, and the gas is hard to flow on the opposite side.

The above shift D of the pressure distribution is indicated by the percentage of D=(La−Lb)/(La+Lb) using the length La from the end of the mounting stage 106 on the side of the exhaust port 126 to the high pressure area, and the length Lb from the end of the mounting stage 106 on the side opposite to the exhaust port 126 to the high pressure area.

Referring to FIG. 5A, the shift D of the pressure distribution of the mounting stage 106 in the treatment chamber 102' of the comparative example 1 is 55.3%. Said differently, it is known that an exhaust gas causes shift by taking air from the exhaust port 126 so as to cause the shift of the pressure distribution of the mounting stage 106.

As such when the pressure distribution on the mounting stage 106 causes the shift depending on the position of the exhaust port 126, an ashing rate and so on is influenced so as to degrade the uniformity of the desired plasma process.

Meanwhile, referring to FIG. 5B, the shift D of the pressure distribution of the mounting stage 106 becomes 12.3% in the treatment chamber 102 of the embodiment. Therefore, the shift of the pressure distribution is improved in comparison with the comparative example 1. In the treatment chamber 102 of this embodiment, the gas diffusion path 135 is formed like a ring, the opening 136 is formed in the entire periphery, and the slant is formed in the opening 136 depending on the position of the exhaust port so as to change the height of the opening 136. Specifically, the conductance is controlled such that the height of the opening 136 at a position close to the exhaust port 126 is made lower than the height of the opening 136 at a position farther from the exhaust port 126 to prevent the gas from easily passing therethrough. With this, the shift of the exhaust gas is canceled to improve the shift of the pressure distribution of the mounting stage 106. The treatment chamber 102 has a shift D of about 10% in the pressure distribution of the mounting stage 106. This shift is considered to be caused by an influence of the carry-in and carry-out port 132 of the gate valve 130 provided in the treatment chamber 102. Therefore, by designing the width of the opening 136 in consideration of the structure of the carry-in and carry-out port 132, it is possible to cancel the shift of the exhaust gas D or make the shift closer to 0.

Figure 5C:
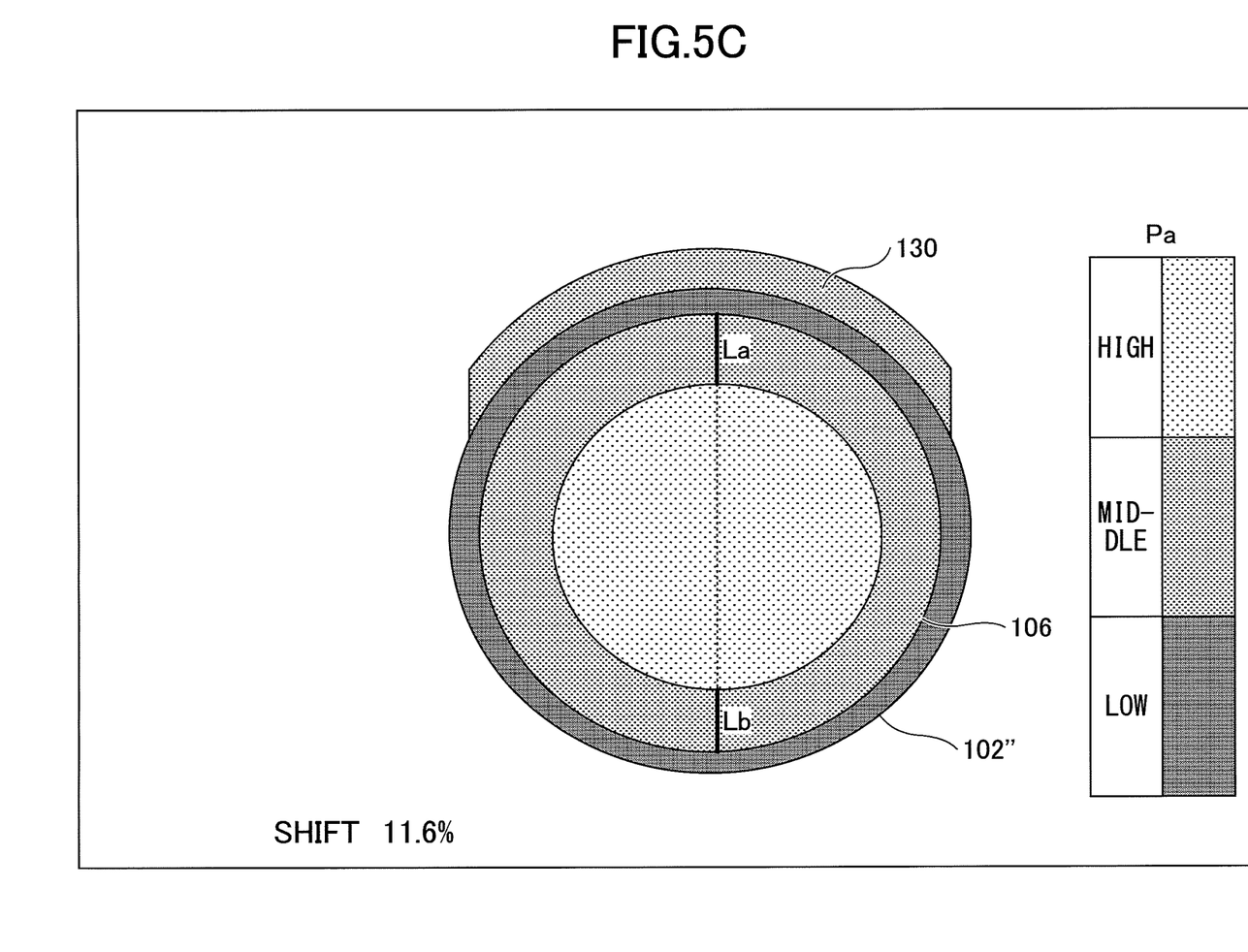

As illustrated in FIG. 4, a diffusion path and an opening are not formed in the liner 134" inside the treatment chamber 102" of the plasma process apparatus 10" of the comparative example 2. Further, the exhaust port 126 is provided on the lower side of the mounting stage 106, penetrates through the bottom wall of the reaction container 110, is connected to the exhaust device 128, and the exhaust direction is downward. The other part of the structure is the same as that of the plasma process apparatus 10 of the embodiment illustrated in FIG. 1. Conditions for simulation are similar to those for the simulations illustrated in FIGS. 5A and 5B. As illustrated in FIG. 5C, the shift D of the pressure distribution on the mounting stage 106 in the treatment chamber 102 is 11.6% and is substantially similar to the shift D 12.3% of the shift D of the pressure distribution of the mounting stage 106 in the treatment chamber 102 of this embodiment illustrated in FIG. 5B. Therefore, the exhaust port 126 may be provided to penetrate through the bottom wall of the reaction container 110 and to direct downward.

Figure 6A:
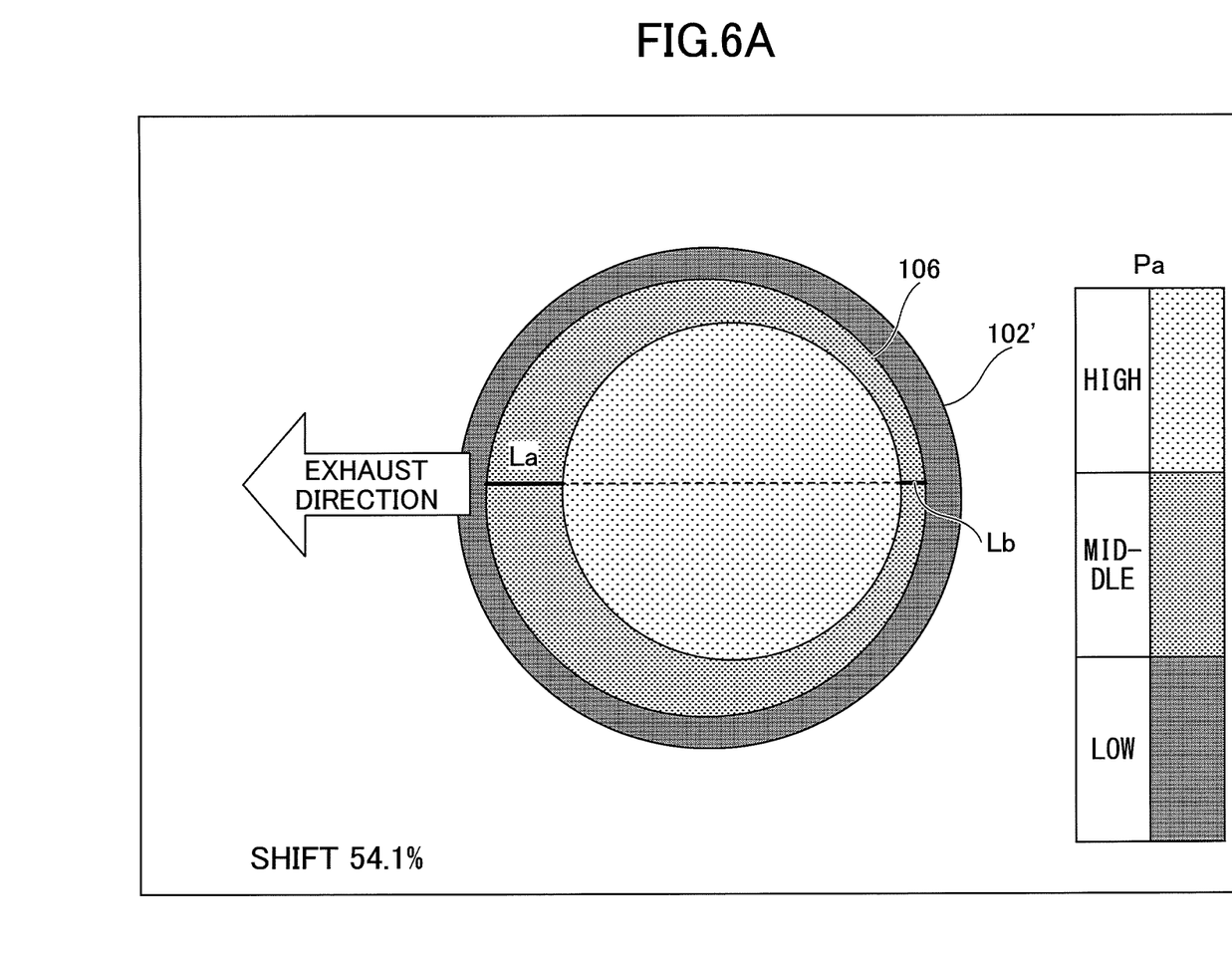
FIGS. 6A and 6B illustrate an example of the simulation result of the pressure distribution of the treatment chamber according to the embodiment.

An example of the simulation result in the treatment chamber 102' of the comparative example 3 illustrated FIG. 6A is obtained by calculating the shift D of the pressure distribution on the mounting stage 106 in conditions where the gate valve 130 of the carry-in and carry-out port 132 in the treatment chamber 102' of the comparative example 1 illustrated FIG. 5A is closed. Conditions for the simulation are similar to those for the simulations illustrated in FIGS. 5A to 5C. In this case, the shift D of the pressure distribution of the mounting stage 106 is 54.1%, which is slightly improved than the shift of the comparative example 1 illustrated in FIG. 5A.

From the above result, the plasma process apparatus 10 of this embodiment can cancel the shift of exhaust gas in the treatment chamber 102. However, it is proved that the gate valve 130 greatly influences the reason why the shift D of the pressure distribution on the mounting stage 106 does not completely disappear.

Figure 6B:
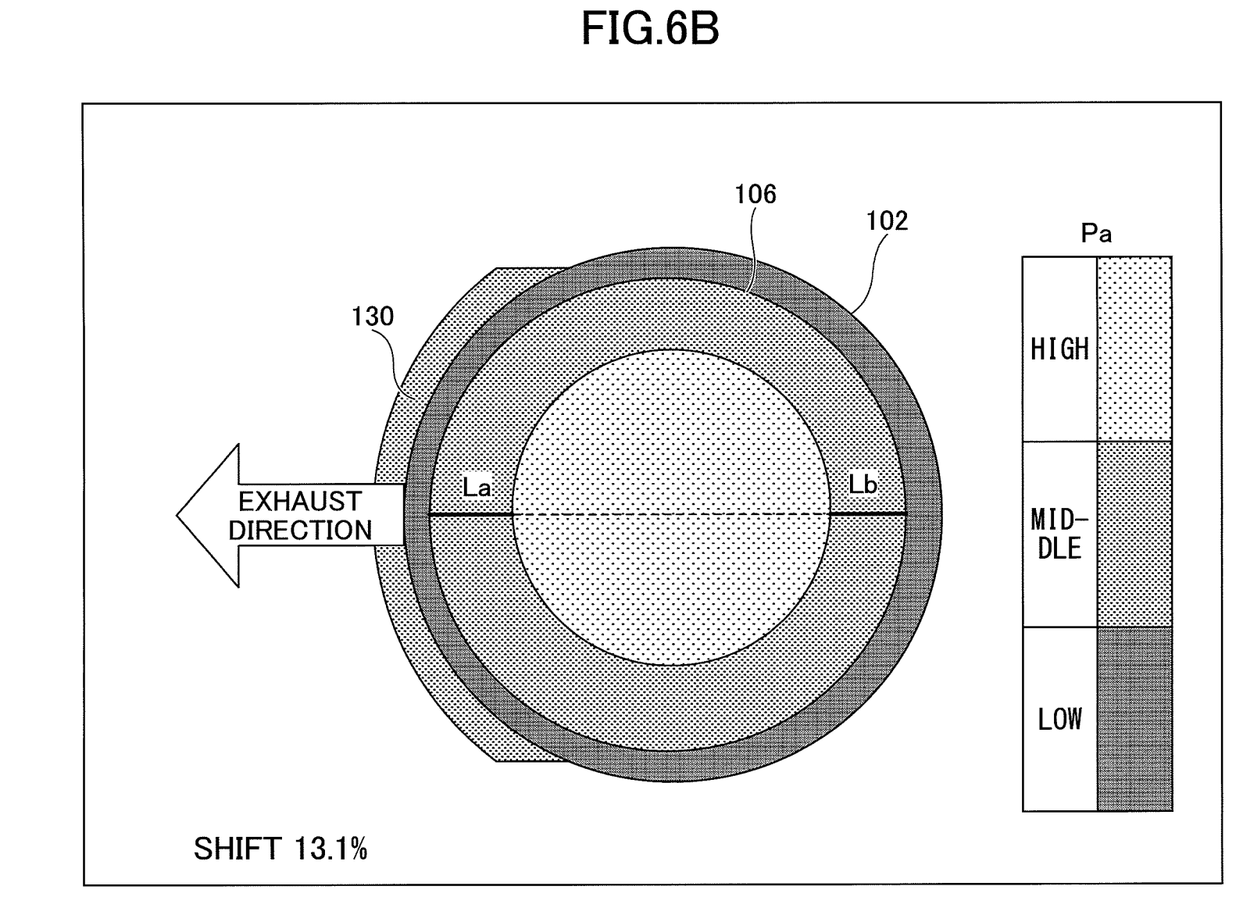

FIG. 6B illustrates an example of the result of simulating the shift D of the pressure distribution of the mounting stage 106 at the time of setting the simulation conditions of high pressure and a high flow rate in the treatment chamber 102 of this embodiment. The conditions of the simulation are set such that the flow rates of introducing a hydrogen gas is 5000 sccm and an argon gas of 18000 sccm and the pressure of the treatment chamber 102 of 5 Torr (666 Pa).

According to this, in the conditions of the high pressure and the high flow rate, the shift D of the pressure distribution of the mounting stage 106 is 13.1%. With this, it is proved that the shift of exhaust gas can be canceled in the treatment chamber 102 even in the conditions of the high pressure and the high flow rate, the uniformity of the ashing process for the wafer W is assured, and the process window can be widened.

Figure 7:
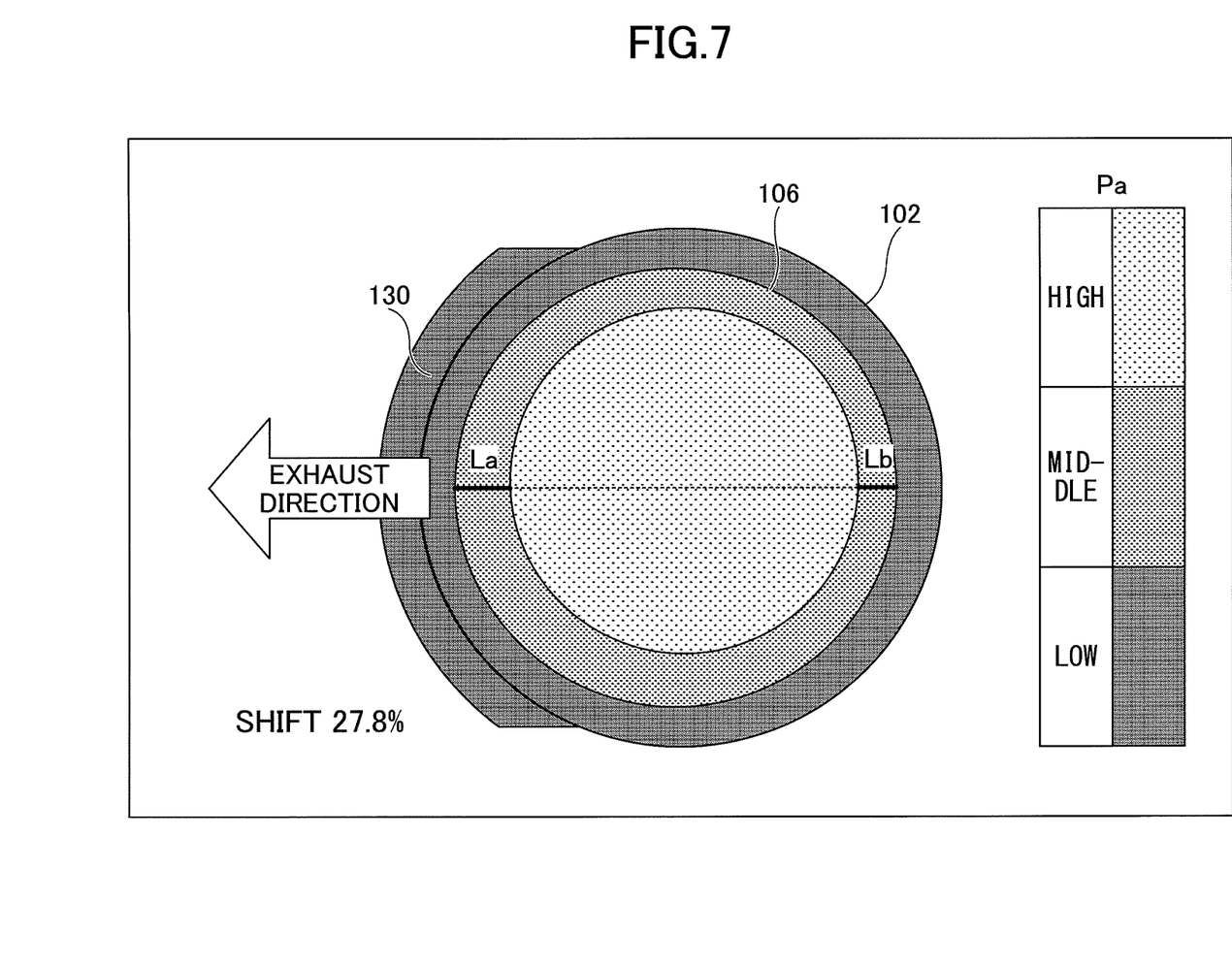
FIG. 7 illustrates an example of the simulation result of the pressure distribution of the treatment chamber according to the embodiment.

FIG. 7 illustrates a result of simulating the shift D of the pressure distribution even in the conditions of the low pressure and the low flow rate. Referring to FIG. 7, the conditions are set such that the flow rates of introducing a hydrogen gas is 50 sccm and an argon gas of 180 sccm and the pressure of the treatment chamber 102 of 0.5 Torr (66.6 Pa).

With this, in a case where a gas is exhausted from the treatment chamber 102 in the conditions of the low pressure and the low flow rate, the shift D of the pressure distribution of the mounting stage 106 is 27.8%. Thus, the improvement of the pressure distribution is not high in comparison with the conditions of the high pressure and the high flow rate. It is thought that the effect of correcting the gas is lowered in the conditions of the low pressure and the low flow rate because the gas in the treatment chamber 102 is changed from the continuous flow to the molecule flow.

An effect of canceling the shift of the exhaust gas using the structure of the treatment chamber 102 becomes high in an area of a continuous flow and lower in areas of a transition flow and a molecule flow than in the area of the continuous flow.

Figure 8:
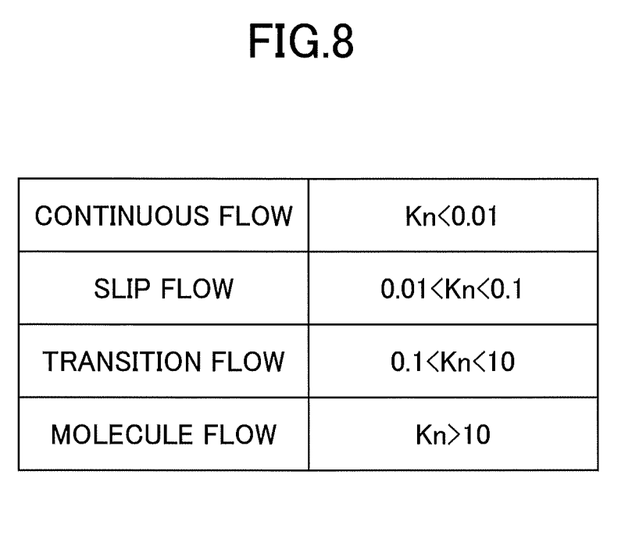
FIG. 8 illustrates a relation between gas flow and Knudsen number.

Referring to FIG. 8, in a case where a gas flows, when the Knudsen number Kn is smaller than 0.01 Kn, the gas flow is defined as a continuous flow. When the Knudsen number Kn is greater than 0.01 and smaller than 0.01, the gas flow is defined as a slip flow. When the Knudsen number Kn is greater than 0.1 and smaller than 10, the gas flow is defined as a slip flow. When the Knudsen number Kn is greater than 10, the gas flow is defined as a molecule flow.

Because it is unnecessary to distinguish the continuous flow from the slip flow, if the continuous flow includes the slip flow in its meaning, the effect of cancelling the shift of exhaust gas is enhanced using the structure of the treatment chamber 102 in a condition where the Knudsen number Kn is smaller than 0.1. Therefore, it is preferable that the plasma process apparatus 10 of the embodiment is used in the condition that the Knudsen number Kn calculated from Formula 1 is smaller than 0.1.

The Knudsen number Kn is defined by Formula 1.

[Formula 1]

$$Kn = \lambda/L \qquad (1)$$

Here, λ represents a mean free path (m), and L represents a characteristic length (m). Further, the mean free path λ can be represented by Formula 2.

[Formula 2]

$$\lambda = \frac{1}{\sqrt{2}\, n\pi\sigma^2} = \frac{k_B T}{\sqrt{2}\, p\pi\sigma^2} \qquad (2)$$

$$p = nk_B T$$

Here, n represents a gaseous molecule density ($m^{-3}$), σ represents a molecule diameter (m), p represents pressure (Pa), KB represents a Boltzmann constant (J/K), and T represents a temperature (K).

The characteristic length L is the minimum value of a gas passageway. In the plasma process apparatus 10 of the present invention, the minimum value of the gas passageway is 0.5 mm of the gas flow inlet 113 to the plasma generation chamber 104. If the characteristic length L is 0.5 mm, the Knudsen number obtained by assigning the following conditions to Formula 1 and Formula 2 for an argon gas is 0.2509. Therefore, a gas flow in the treatment chamber 102 is a transition flow, and critical pressure is 1.25 Torr (166.7 Pa).

<Conditions>

| | |
|---|---|
| Gaseous species | Argon gas |
| Pressure | 66.66 Pa |
| Temperature (Wall) | 353.15 K |
| Characteristic length | 0.5 mm |
| Molecular diameter | $3.62e^{-10}$ m |
| Boltzmann constant | $1.38e^{-23}$ J/K |
| Mean free path | $1.25e^{-4}$ m |
| Knudsen number | 0.2509 |

Even though the dimension of the gas flow inlet 113 for the plasma generation chamber 104 is 0.5 mm, this dimension of 0.5 mm rarely affects an exhaust gas flow from the treatment chamber. Within this embodiment, the minimum value of the gas passageway affecting the exhaust gas is φ3 mm, which is the diameter of the through hole 144 of the partition wall member 140. Therefore, the characteristic length L is set to be 3 mm, the above characteristic length in <Conditions> L is changed, and the Knudsen number is calculated, the critical pressure of the treatment chamber 102 becomes 0.2 Torr (26.6 Pa). However, because the value of the Knudsen number changes depending on the pressure, the type of gas, and the characteristic length, the calculated value of the Knudsen number is naturally changed when the gaseous species change.

As described above, according to the the plasma process apparatus 10 of this embodiment, the diffusion path 135 having a sufficiently small conductance and being shaped like a ring is provided at a front stage of the exhaust port 126 of the treatment chamber 102, and the opening 136 opened in a shape of the circumference is provided on the internal diameter side of the gas diffusion path 135. Further, the slant is formed at the opening 136 in the peripheral direction. For example, the height of the slant is made lower as the position of the slant approaches. With this, the conductance at a time of exhausting the gas is adjusted, and the shift of the exhaust gas is the treatment chamber 102 is canceled so as to obtain the uniformity in the asking process. Especially, in the process of the high flow rate and the high pressure, the effect of canceling the shift of the exhaust gas is similarly obtained so as to enable the process window to be widened. Further, by providing the ring-like diffusion path 135 and the opening 136 inside the treatment chamber 102, the above effect is obtainable and the increase of a cost is avoidable.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority or inferiority of the invention. Although the processing device has been described in detail, it should be understood that various changes, substitutions, and alterations could be made thereto without departing from the spirit and scope of the invention.

For example, according to the present invention, the diffusion path 135 can be arranged in the vicinity of the gas exhaust port of the plasma process apparatus such as a Chemical Vapor Deposition (CVD) apparatus and an Atomic Layer Deposition (ALD) apparatus. In this cases also, it is preferable that the conditions for making the Knudsen number Kn be present in the area of the continuous flow.

According to an aspect of the present invention, it is possible to cancel the shift of the exhaust gas in the treatment chamber.

What is claimed is:

1. A processing device comprising:
   a reaction container that receives a gas that flows, the reaction container including
   a plasma generation chamber configured to generate plasma from the gas, the plasma containing radical,
   a partition wall member having a plurality of through holes and being provided between the plasma generation chamber and a treatment chamber, and
   the treatment chamber configured to provide a predetermined process using the plasma to an object to be processed that is mounted on a mounting stage supported by a supporting member provided on a bottom wall of the reaction container;
   a member that is provided on a sidewall or a bottom wall of the reaction container and forms a diffusion path,
   wherein the member includes a first member, a second member, and an opening, respectively having ring-like shapes,
   wherein an air gap thoroughly separates surfaces of the first and second members from surfaces of the mounting stage and the supporting member,
   wherein the second member is provided adjacent to the side wall of the treatment chamber so as to protect the side wall,
   wherein the first member is formed on the second member so as to radially protrude to an inside of the reaction container and has a first portion that radially extends to a lower space formed below the mounting stage and a second portion formed from a tip of the first portion and vertically extending toward a bottom surface of the reaction container at an angle from the first portion, and
   wherein the opening is present lower than the mounting stage and between the first member and the reaction container to cause a space of the treatment chamber and a space of the diffusion path to communicate, an opening area of the opening becomes narrower as a position of the opening is closer to an exhaust port, the opening is formed along a horizontal direction so as to have a predetermined height between the first member and the bottom wall of the reaction container at an inner periphery of the ring-like shape and forming slant in the height along the inner periphery of the ring-like shape, and wherein the radical flows from the plasma generation chamber through the plurality of through holes of the partition member into the treatment chamber, further flows through the opening and the diffusion path, and exhausted from the exhaust port.

2. The processing device according to claim 1,
wherein the processing device is used in conditions where a Knudsen number Kn is smaller than 0.1, the Knudsen number Kn being obtainable by assigning a result of Formula 2 to Formula 1:

[Formula 1]

$$Kn = \lambda/L \qquad (1)$$

[Formula 2]

$$\lambda = \frac{1}{\sqrt{2}\, n\pi\sigma^2} = \frac{k_B T}{\sqrt{2}\, p\pi\sigma^2} \qquad (2)$$

$$p = nk_B T$$

where $\lambda$ represents a mean free path m,
L represents a characteristic length m,
n represents a gaseous molecule density $m^{-3}$,
$\sigma$ represents a molecule diameter m,
p represents pressure Pa,
KB represents a Boltzmann constant J/K, and
T represents a temperature K.

3. The processing device according to claim 1,
wherein a cross-sectional area of the exhaust port at a part where the diffusion path and the exhaust port communicate is equal to a cross-sectional area of the diffusion path or smaller.

4. The processing device according to claim 1,
wherein the opening includes a filter, and
wherein an opening ratio of a portion of the filter changes in response to a distance of the portion of the filter from the exhaust port.

5. The processing device according to claim 4,
wherein the opening ratio of the portion of the filter becomes smaller as the portion is closer to the exhaust port.

6. The processing device according to claim 2,
wherein the Knudsen number Kn is smaller than 0.01.

7. The processing device according to claim 1,
wherein the diffusion path is formed within a space surrounded by the first member and the second member.

8. The processing device according to claim 1,
wherein the diffusion path communicates with the exhaust port and is formed within a space surrounded by the first member and the second member.

9. The processing device according to claim 1,
wherein the processing device is of an induction coupled plasma type.

10. The processing device according to claim 1,
wherein the exhaust port penetrates through the member forming the diffusion path and the wall of the treatment chamber.

11. The processing device according to claim 1, the processing device further comprising:
a gas supplying unit including a gas diffusion path and a gas flow inlet,
the gas diffusion path being formed like a ring between a lower surface at an outer peripheral end of a lid and the side wall of the reaction container to diffuse the gas flown through the side wall of the reaction container,
the gas flow inlet formed between the gas diffusion path and an internal space of the plasma generation chamber to introduce the gas into the internal space of the plasma generation chamber.

12. The processing device according to claim 11,
wherein the partition wall member is attached to an upper portion of the second member to spacially separates the treatment chamber from the plasma generation chamber.

13. The processing device according to claim 1,
wherein lower surfaces respectively of the member and the supporting member of the mounting stage level on an inner surface of the bottom wall of the reaction container.

* * * * *